United States Patent
Lim et al.

(10) Patent No.: US 9,484,203 B2
(45) Date of Patent: Nov. 1, 2016

(54) METHODS OF MANUFACTURING SEMICONDUCTOR DEVICES

(71) Applicant: SAMSUNG ELECTRONICS CO., LTD., Suwon-si, Gyeonggi-do (KR)

(72) Inventors: Jun-Hee Lim, Seoul (KR); Ki-Jae Hur, Seoul (KR); Sung-Hwan Kim, Suwon-si (KR); Hae-In Jung, Suwon-si (KR); Soo-Jin Hong, Guri-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/535,437

(22) Filed: Nov. 7, 2014

(65) Prior Publication Data
US 2015/0235852 A1    Aug. 20, 2015

(30) Foreign Application Priority Data
Feb. 19, 2014    (KR) .................. 10-2014-0018839

(51) Int. Cl.
*H01L 21/336* (2006.01)
*H01L 21/8234* (2006.01)
*H01L 21/265* (2006.01)
*H01L 21/324* (2006.01)
*H01L 29/423* (2006.01)
*H01L 29/78* (2006.01)
*H01L 29/66* (2006.01)

(52) U.S. Cl.
CPC ....... *H01L 21/26506* (2013.01); *H01L 21/324* (2013.01); *H01L 29/4236* (2013.01); *H01L 29/66575* (2013.01); *H01L 29/78* (2013.01); *H01L 29/6656* (2013.01)

(58) Field of Classification Search
CPC .............. H01L 21/26506; H01L 21/26513; H01L 21/30604; H01L 21/3247; H01L 21/02532; H01L 21/2652; H01L 21/324; H01L 29/6656; H01L 29/41783; H01L 29/66575; H01L 29/78; H01L 29/4236; H01L 29/66492; H01L 21/02381; H01L 21/0245
USPC .............................. 438/197, 305, 530, 514
See application file for complete search history.

(56) References Cited

U.S. PATENT DOCUMENTS

| | | | |
|---|---|---|---|
| 6,524,883 B2 | 2/2003 | Kim | |
| 7,190,040 B2 | 3/2007 | Liu | |
| 8,394,704 B2 | 3/2013 | Bidal et al. | |
| 2006/0003533 A1* | 1/2006 | Kammler | H01L 21/26506 438/300 |
| 2008/0121990 A1* | 5/2008 | Hasunuma | H01L 27/10876 257/333 |

FOREIGN PATENT DOCUMENTS

| | | |
|---|---|---|
| JP | 09-306838 A | 11/1997 |
| JP | 2011-151174 A | 8/2011 |
| KR | 10-1993-0024124 A | 12/1993 |
| KR | 10-1997-0003805 A | 1/1997 |
| KR | 10-0208439 B1 | 7/1999 |
| KR | 10-2000-0004536 A | 1/2000 |
| KR | 10-2009-0022360 A | 3/2009 |

* cited by examiner

*Primary Examiner* — Thien F Tran
(74) *Attorney, Agent, or Firm* — Lee & Morse P.C.

(57) ABSTRACT

In a method of manufacturing a semiconductor device, a gate structure is formed on a substrate. An ion implantation process is performed at an upper portion of the substrate exposed by the gate structure, so that an ion implantation region is formed to have an expanded volume. The ion implantation process uses ions that are identical to a material of the substrate.

20 Claims, 10 Drawing Sheets

METHODS OF MANUFACTURING SEMICONDUCTOR DEVICES

CROSS-REFERENCE TO RELATED APPLICATIONS

This application claims priority under 35 USC §119 to Korean Patent Application No. 10-2014-0018839, filed on Feb. 19, 2014, in the Korean Intellectual Property Office (KIPO), the contents of which are herein incorporated by reference in their entirety.

BACKGROUND

Example embodiments relate to methods of manufacturing semiconductor devices.

Recently, as the integration degree of a semiconductor device has been increased, a channel length of a transistor has been decreased. Also, electrical characteristics of the semiconductor device have been degraded due to a short channel effect. Therefore, it is necessary to study methods of manufacturing semiconductor devices which may prevent degradation of the electrical characteristics of the semiconductor devices, may provide a predetermined punch through margin, and may reduce contact resistances of a source region and a drain region.

SUMMARY

Example embodiments provide a method of manufacturing a semiconductor device which may prevent degradation of the electrical characteristics of the semiconductor device.

According to example embodiments, there is provided a method of manufacturing a semiconductor device. In the method, a gate structure is formed on a substrate. An ion implantation process is performed about an upper portion of the substrate exposed by the gate structure, so that an ion implantation region is formed to have an expanded volume. The ion implantation process uses ions that are substantially identical to a material of the substrate.

In example embodiments, the substrate may include a silicon substrate, and the ion implantation process may use silicon ions.

In example embodiments, the ion implantation process may implant the silicon ions with a concentration of about $1.0E15$ ions/cm$^2$ to about $1.0E20$ ions/cm$^2$.

In example embodiments, a top surface of the ion implantation region may be higher than a bottom surface of the gate structure. A bottom surface of the ion implantation region may be lower than the bottom surface of the gate structure.

In example embodiments, the ion implantation region may be exposed by the gate structure.

In example embodiments, a source region and a drain region may be formed by doping impurities into the ion implantation region.

In example embodiments, a heat treatment process may be performed at a temperature between about 600° C. and about 1100° C. to crystallize the ion implantation region, thereby increasing a volume of the ion implantation region.

In example embodiments, an isolation layer including an insulation material may be formed at an upper portion of the substrate. The forming the ion implantation region may include forming a first ion implantation region exposed by the isolation layer and forming a second ion implantation region on the isolation layer.

In example embodiments, a wet etching process may be performed to remove the second ion implantation region.

In example embodiments, a spacer may be formed on a sidewall of the gate structure.

In example embodiments, a spacer structure may be formed on a sidewall of the gate structure. The spacer structure may include a first spacer and a second spacer.

In example embodiments, an insulating interlayer is formed to cover the gate structure before performing the ion implantation process. The insulating interlayer is partially removed to form a contact hole exposing a top surface of the substrate. The ion implantation region may be formed at an upper portion of the substrate exposed by the contact hole.

In example embodiments, the ions may be accelerated by an energy of about 1 KeV to about 5 KeV.

According to other example embodiments, there is provided a method of manufacturing a semiconductor device. In the method, a gate structure is buried at an upper portion of a substrate. An ion implantation process is performed about an upper portion of the substrate exposed by the gate structure, so that an ion implantation region is formed to have an expanded volume. The ion implantation process uses ions that are substantially identical to a material of the substrate.

In example embodiments, the substrate may include a silicon substrate, and the ion implantation process may use silicon ions.

In example embodiments, a top surface of the ion implantation region may be higher than a top surface of the gate structure, and a bottom surface of the ion implantation region may be lower than the top surface of the gate structure.

BRIEF DESCRIPTION OF THE DRAWINGS

Example embodiments will be more clearly understood from the following detailed description taken in conjunction with the accompanying drawings.

FIGS. 1 to 6 illustrate cross-sectional views of stages in a method of manufacturing a semiconductor device in accordance with some example embodiments;

FIGS. 7 to 11 illustrate cross-sectional views of stages in a method of manufacturing a semiconductor device in accordance with some example embodiments;

FIGS. 12 to 16 illustrate cross-sectional views of stages in a method of manufacturing a semiconductor device in accordance with some example embodiments; and FIGS. 17 to 20 illustrate cross-sectional views of stages in a method of manufacturing a semiconductor device in accordance with some example embodiments.

DETAILED DESCRIPTION

Figure 1:
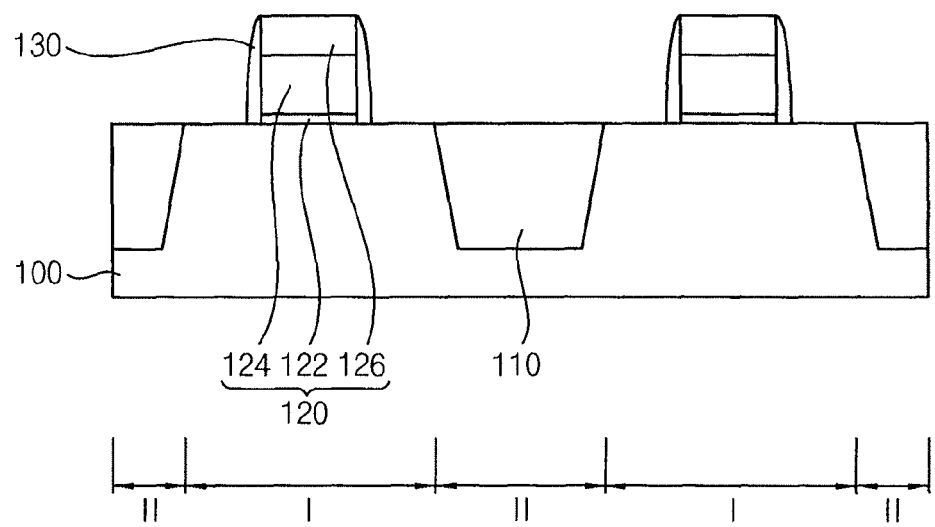
FIGS. 1 to 20 represent non-limiting, example embodiments as described herein.

Various example embodiments will be described more fully hereinafter with reference to the accompanying drawings, in which some example embodiments are shown. Example embodiments may, however, be embodied in many different forms and should not be construed as limited to those set forth herein. Rather, these example embodiments are provided so that this description will be thorough and complete, and will fully convey the scope of the exemplary implementations to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1 to 6 illustrate cross-sectional views of a method of manufacturing a semiconductor device in accordance with some example embodiments.

Referring to FIG. 1, an isolation layer 110 may be formed at an upper portion of a substrate 100, and a gate structure 120 and a spacer 130 may be formed on the substrate 100.

The substrate 100 may include a semiconductor substrate such as a silicon substrate, germanium substrate or a silicon-germanium substrate, a substrate having a semiconductor layer and an insulation layer such as a silicon-on-insulator (SOI) substrate or a germanium-on-insulator (GOI) substrate, or a single crystalline metal oxide substrate.

The isolation layer 110 may be formed by a shallow trench isolation (STI) process using a silicon oxide and/or a silicon nitride. That is, a trench may be formed by partially removing an upper portion of the substrate 100, and the isolation layer 110 may be formed to fill the trench. Therefore, the substrate 100 may be divided into a field region II including the isolation layer 110 and an active region I excluding the isolation layer 110. In an example embodiment, the isolation layer 110 may include a silicon oxide.

Then, the gate structure 120 may be formed in the active region I on the substrate 100. A gate insulation layer, a gate electrode layer and a gate mask layer may be sequentially formed on the substrate 100 and the isolation layer 110, and then the gate insulation layer, the gate electrode layer and the gate mask layer may be partially removed to form the gate structure 120. Therefore, the gate structure 120 may include a gate insulation layer pattern 122, a gate electrode 124 and a gate mask 126 which may be sequentially stacked on a top surface of the substrate 100. In example embodiments, a plurality of gate structures 120 may be formed in the active region I on the substrate 100.

In example embodiments, the gate insulation layer may be formed using a silicon oxide, a silicon nitride, aluminum oxide or a metal oxide having high-k dielectric constant by a chemical vapor deposition (CVD) process, a plasma enhanced chemical vapor deposition (PECVD) process, a high density plasma (HDP) CVD process, an atomic layer deposition (ALD) process. For example, the gate insulation layer may include $HfO_2$, HfON, $HfSi_2O$, HfSiO, HfSiON, HfAlO, HfLaO, $La_2O_3$ or a mixture thereof.

A spacer layer may be formed on the substrate 100 and the isolation layer 110 to cover the gate structure 120, and then the spacer layer may be partially removed by an anisotropic etching process, thereby forming a spacer 130 on a sidewall of the gate structure 120. For example, the spacer 130 may include a silicon oxide, a silicon nitride or a silicon oxynitride.

Figure 2:
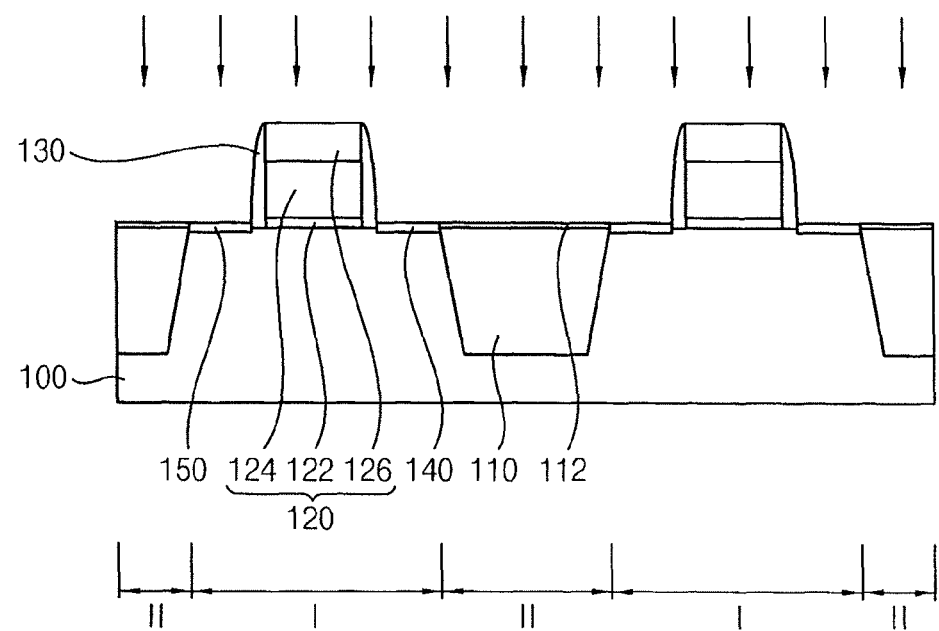

Referring to FIG. 2, an ion implantation process may be performed about, e.g., at, upper portions of the substrate 100 and the isolation layer 110, thereby forming a first ion implantation region 140, a second ion implantation region 150 and a third ion implantation region 112.

The ion implantation process may use a predetermined ion which may be substantially identical to a material of the substrate 100. For example, when the substrate 100 includes a silicon substrate, the ion implantation process may use silicon ions to implant into the upper portions of the substrate 100 and the isolation layer 110.

In example embodiments, the ion implantation process may implant the silicon ions with a relatively high concentration of about 1.0E15 ions/cm$^2$ to about 1.0E20 ions/cm$^2$. Further, in order to increase the concentration of the silicon ions, the ion implantation process may be repeated several times. During the ion implantation process, the silicon ions may be accelerated by a relatively low energy of about 1 KeV to about 5 KeV. Therefore, the silicon ions may be injected in the substrate 100 to a depth of about 100 Å.

By performing the ion implantation process, the third ion implantation region 112 may be formed on the isolation layer 110, and the first ion implantation region 140 and the second ion implantation region 150 may be formed on the substrate 100. That is, the first and second ion implantation regions 140 and 150 may have a silicon ion concentration which is substantially higher than that of the substrate 100.

Further, the third ion implantation region 112 may have silicon ion concentration which is substantially higher than that of the isolation layer 110. For example, when the isolation layer 110 includes silicon oxide (SiO$_2$), the third ion implantation region 112 may include silicon oxide (SiO$_x$), wherein 0<X<2. Therefore, the third implantation region 112 may have an electrical resistance which is smaller than that of the isolation layer 110.

The first ion implantation region 140 and the second ion implantation region 150 may be disposed at the upper portions of the substrate 100 adjacent to the gate structure 120. For example, the first ion implantation region 140 and the second ion implantation region 150 may be spaced apart from each other, and the gate structure 120 may be disposed between the first and second ion implantation regions 140 and 150.

By performing the ion implantation process, the upper portions of the substrate 100, which may be exposed by the gate structure 120 and the spacer 130, may inflate. Therefore, bottom surfaces of the first and second ion implantation regions 140 and 150 may be lower than a bottom surface of the gate insulation layer pattern 122, i.e., a bottom surface of the gate structure 120, and top surfaces of the first and second ion implantation regions 140 and 150 may be higher than the bottom surface of the gate insulation layer pattern 122, i.e., the bottom surface of the gate structure 120. That is, the upper portions of the substrate 100, where a source region and a drain region will be formed, may be elevated by the ion implantation process. In an example embodiment, a distance between the top surface and the bottom surface of the first ion implantation region 140 (or the second ion implantation region 150) may be in a range of about 100 angstroms to about 300 angstroms.

Figure 3:
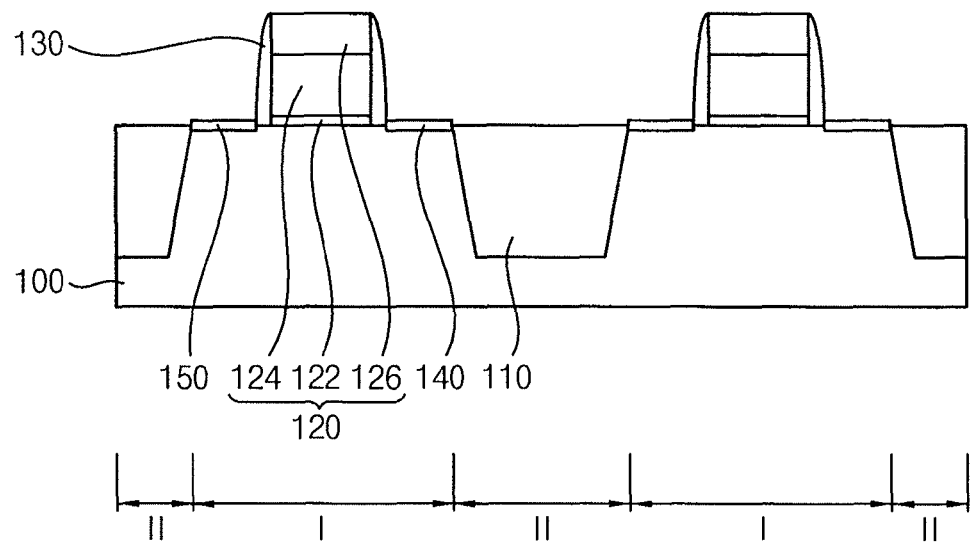

Referring to FIG. 3, the third ion implantation region 112 may be removed by an etching process.

In example embodiments, the third ion implantation region 112 may be selectively removed by a wet etching process. For example, the wet etching process may have a relatively high etch rate of the silicon oxide, as compared to that of the silicon.

As the third ion implantation region 112 is removed, a top surface of the isolation layer 110 may be exposed. As the third ion implantation region 112, which may have a relatively low electrical resistance, is removed, a leakage current between the first ion implantation region 140 and the second ion implantation region 150 may be prevented.

In other example embodiments, the etching process may also remove a fourth implantation region which is disposed on a top surface and a sidewall of the spacer 130 and a top surface of the gate mask 126. Therefore, a leakage current occurred by the fourth implantation region may be prevented.

Figure 4:
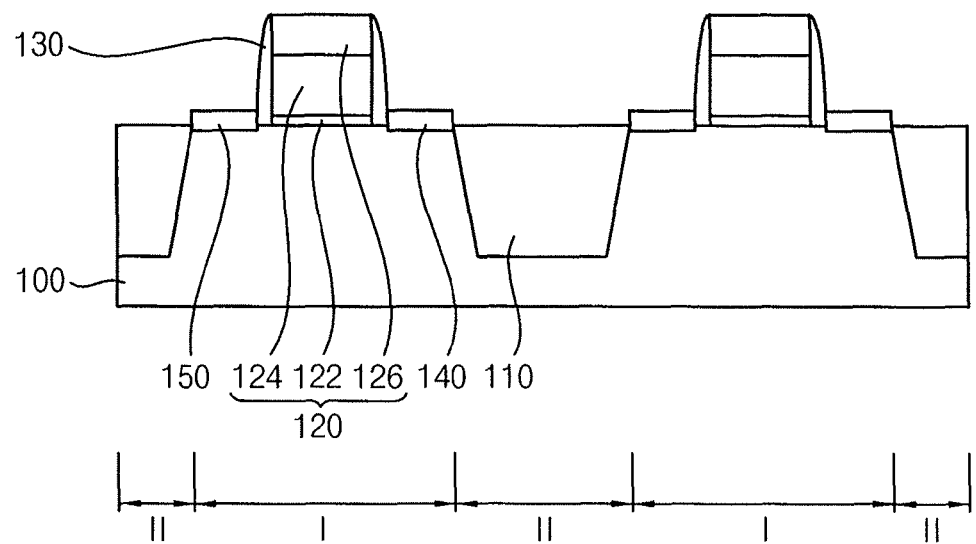

Referring to FIG. 4, a heat treatment process may be performed about the substrate 100 to form an expanded first ion implantation region 142 and an expanded second ion implantation region 152.

The heat treatment process may include, e.g., an annealing process, a rapid thermal annealing (RTA), spike RTA (sRTA) or flash RTA (fRTA). In example embodiments, the heat treatment process may be performed at a temperature between about 600° C. to about 1100° C. for a time of about several seconds to about 30 minutes.

The first ion implantation region 140 and the second ion implantation region 150 may be partially or sufficiently crystallized by the heat treatment process, so that the first ion implantation region 140 and the second ion implantation region 150 may be transferred into the expanded first ion implantation region 142 and the expanded second ion implantation region 152. That is, a distance between a top surface and a bottom surface of the expanded first ion implantation region 142 (or the expanded second ion implantation region 152) may be substantially larger than a distance between the top surface and the bottom surface of the first ion implantation region 140 (or the second ion implantation region 150). Further, the expanded first ion implantation region 142 and the expanded second ion implantation region 152 may have an electrical resistance, which may be lower than those of the first and second ion implantation regions 140 and 150.

Figure 5:
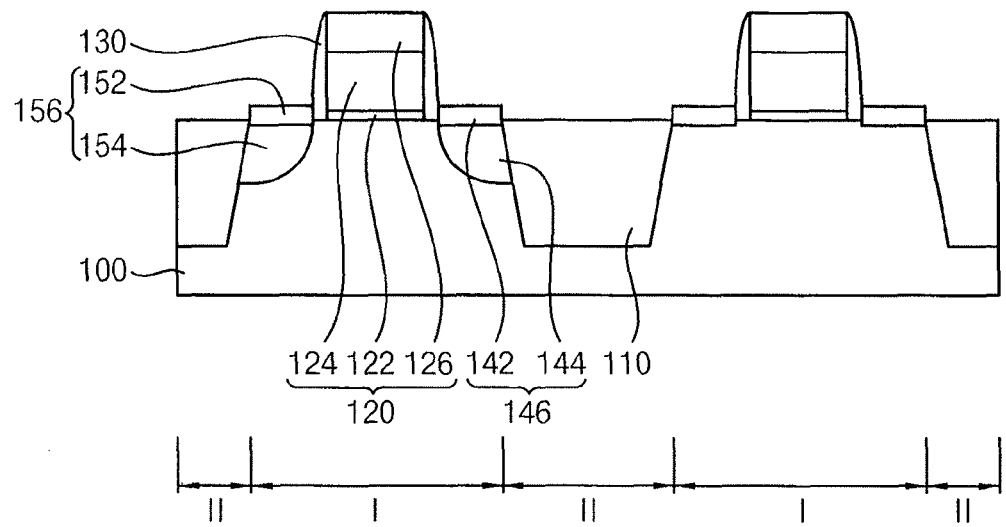

Referring to FIG. 5, impurities may be doped into the upper portions of the substrate 100 to form a first impurity region 144 and a second impurity region 154.

During the impurity doping process, the gate structure 120 and the spacer 130 may serve as an impurity implantation mask. Therefore, the impurities may be doped into the expanded first ion implantation region 142 and the expanded second ion implantation region 152 exposed by the gate structure 120 and the spacer 130. Further, by adjusting acceleration energy, the impurities may be doped into the upper portion of the substrate 100 under the expanded first ion implantation region 142 and the expanded second ion implantation region 152, thereby forming the first impurity region 144 and the second impurity region 154.

Therefore, the expanded first ion implantation region 142, the expanded second ion implantation region 152, the first impurity region 144 and the second impurity region 154 may have a reduced electrical resistance. For example, the expanded first ion implantation region 142 and the first impurity region 144 may serve as a source region 146 of a transistor, and the expanded second ion implantation region 152 and the second impurity region 154 may serve as a drain region 156 of the transistor.

Top surfaces of the source region 146 and the drain region 156 may be substantially higher than the bottom surface of the gate insulation layer pattern 122, so that the transistor may have an elevated source/drain (ESD) structure. Accordingly, the ESD structure may alleviate a short channel effect of the transistor.

According to example embodiments, the transistor having the ESD structure may be formed by performing the ion implantation process and the heat treatment process.

Figure 6:
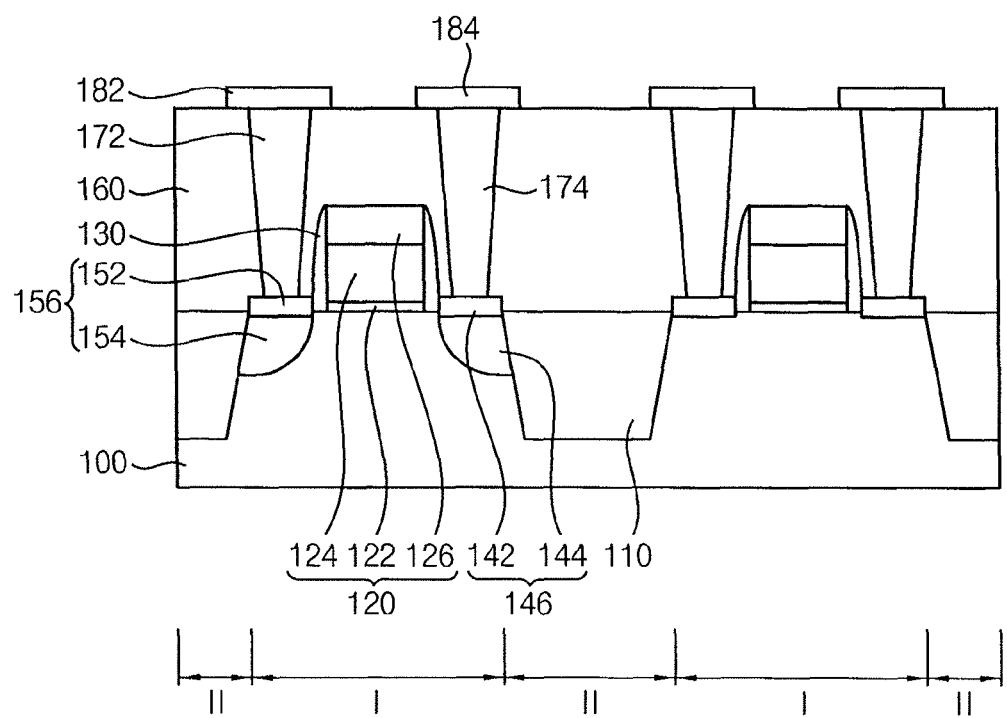

Referring to FIG. 6, after forming an insulating interlayer 160 covering the gate structure 120, contacts 172 and 174 may be formed through the insulating interlayer 160, and then wirings 182 and 184 may be formed on the insulating interlayer 160.

The insulating interlayer 160 may be formed on the substrate 100 to cover the isolation layer 110, the gate structure 120, the spacer 130, the expanded first ion implantation region 142 and the expanded second ion implantation region 152. In example embodiments, the insulating interlayer 160 may be formed using a silicon oxide by a CVD process, a PECVD process or an ALD process.

Then, the insulating interlayer 160 may be partially removed to form contact holes exposing the expanded first ion implantation region 142 and the expanded second ion implantation region 152, and contacts 172 and 174 may be formed to fill the contact holes. The contacts 172 and 174 may be directly connected to the source region 146 and the drain region 156 which may have the ESD structure, respectively, so that contact resistance may be reduced.

FIGS. 7 to 11 illustrate cross-sectional views of a method of manufacturing a semiconductor device in accordance with some example embodiments. The method of manufacturing the semiconductor device may be substantially the same as or similar to the method described with reference to FIGS. 1 to 6 except for a process for forming a first spacer 132 and a second spacer 134 and a heat treatment process.

Figure 7:
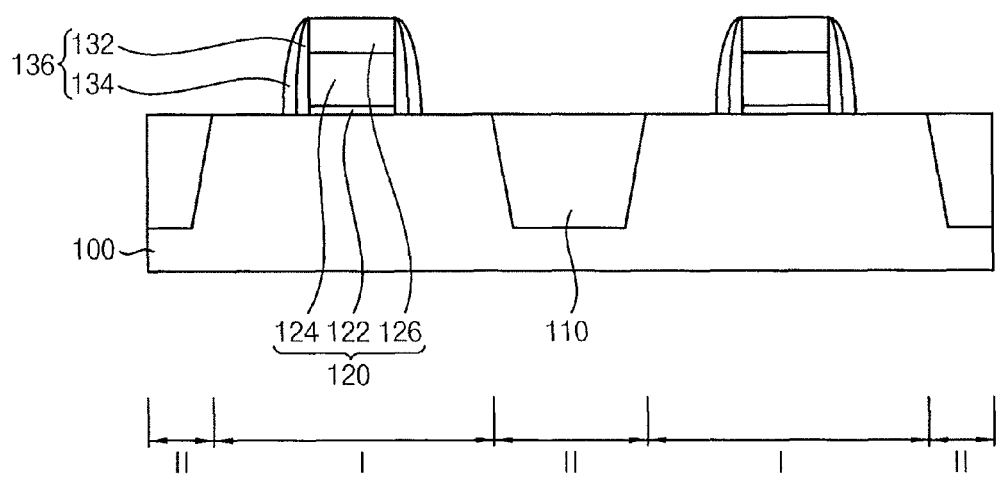

Referring to FIG. 7, an isolation layer 110 may be formed at an upper portion of a substrate 100, and a gate structure 120 and a spacer structure 136 may be formed on the substrate 100.

The processes for forming the isolation layer 110 and the gate structure 120 may be substantially the same as or similar to the processes described with reference to FIG. 1.

Then, the spacer structure 136 may be formed on a sidewall of the gate structure 120.

In an example embodiments, a first spacer layer and a second spacer layer may be formed on the substrate 100 and the isolation layer 110 to cover the gate structure 120, and then the first spacer layer and the second spacer layer may be partially removed by an anisotropic etching process, thereby forming the spacer structure 136 including the first spacer 132 and the second spacer 134 on a sidewall of the gate structure 120. For example, the first spacer 132 and the second spacer 134 may include a silicon oxide, a silicon nitride or a silicon oxynitride.

In other example embodiments, impurities may be doped into an upper portion of the substrate 100 to form a lightly doped drain (LDD) region during processes for forming the spacer structure 136.

Figure 8:
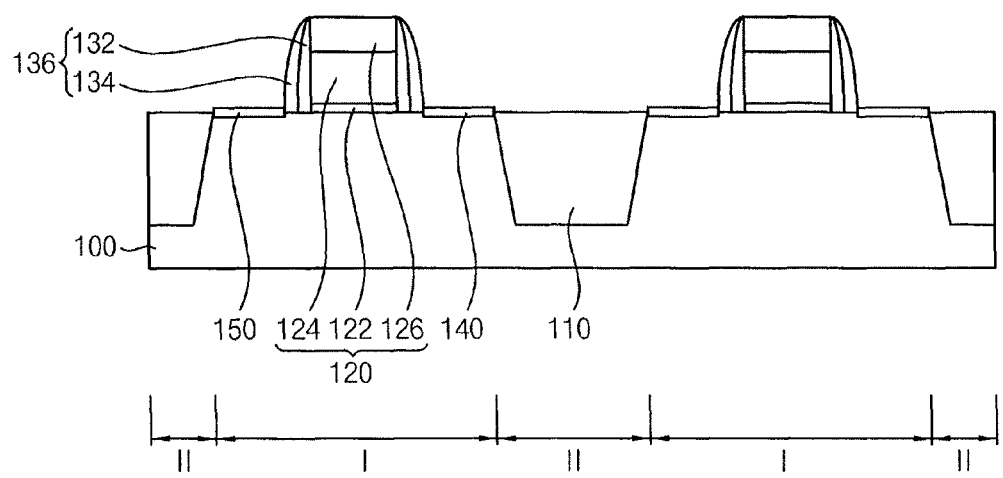

Referring to FIG. 8, an ion implantation process may be performed about upper portions of the substrate 100 and the isolation layer 110, thereby forming a first ion implantation region 140 and a second ion implantation region 150.

The ion implantation process may be substantially the same as the ion implantation process described with reference to FIG. 2. Therefore, the first ion implantation region 140 and the second ion implantation region 150 may be formed at the upper portion of the substrate 100 exposed by the gate structure 120 and the spacer structure 136.

By performing the ion implantation process, the upper portions of the substrate 100, which may be exposed by the gate structure 120 and the spacer structure 136, may inflate. Therefore, bottom surfaces of the first and second ion implantation regions 140 and 150 may be lower than a bottom surface of the gate insulation layer pattern 122, and top surfaces of the first and second ion implantation regions 140 and 150 may be higher than the bottom surface of the gate insulation layer pattern 122.

Figure 9:
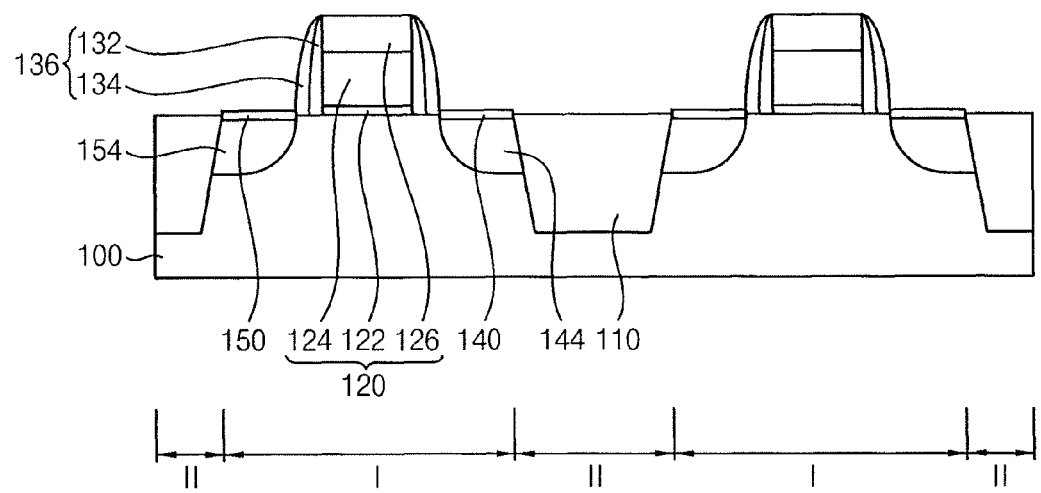

Referring to FIG. 9, impurities may be doped into the upper portions of the substrate 100 to form a first impurity region 144 and a second impurity region 154.

During the impurity doping process, the gate structure 120 and the spacer structure 136 may be served as an impurity implantation mask. Therefore, the impurities may be doped into the first ion implantation region 140 and the second ion implantation region 150 exposed by the gate structure 120 and the spacer structure 136. Further, by adjusting acceleration energy, the impurities may be doped into the upper portion of the substrate 100 under the first ion implantation region 140 and the expanded second ion implantation region 150, thereby forming the first impurity region 144 and the second impurity region 154.

Figure 10:
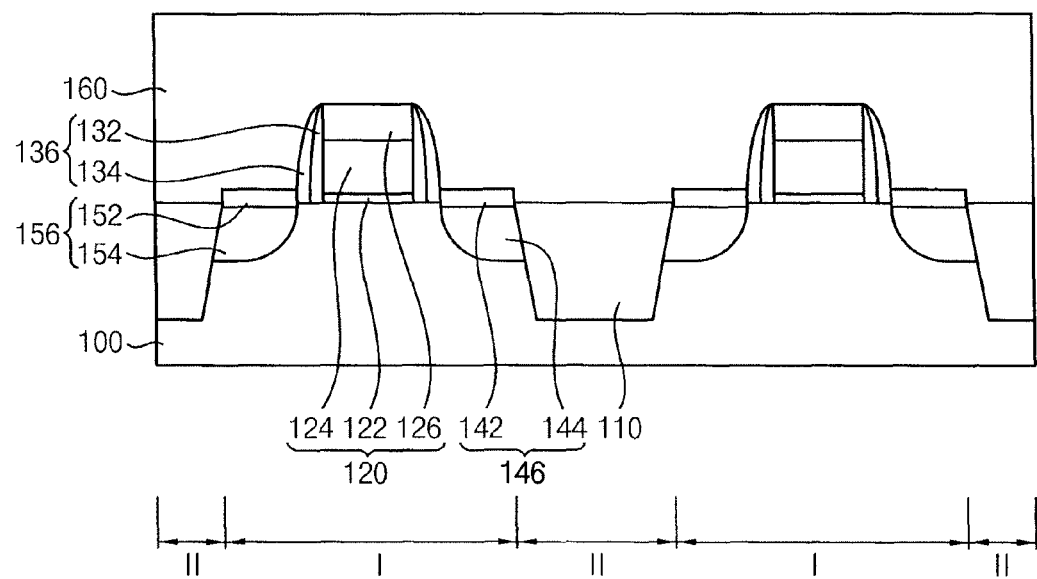

Referring to FIG. 10, an insulating interlayer 160 may be formed to cover the gate structure 120 and the spacer structure 136.

The insulating interlayer 160 may be formed on the substrate 100 and the isolation layer 110 to cover the gate structure 120, the spacer structure 136, the first ion implantation region 140 and the second ion implantation region 150. In example embodiments, the insulating interlayer 160 may be formed using a silicon oxide by a CVD process, a PECVD process or an ALD process.

For example, the insulating interlayer 160 may be formed at a temperature above about 250° C. Therefore, the first ion implantation region 140 and the second ion implantation region 150 may be partially or sufficiently crystallized during the process for forming the insulating interlayer 160. Therefore, the first ion implantation region 140 and the second ion implantation region 150 may be transferred into the expanded first ion implantation region 142 and the expanded second ion implantation region 152. Further, the expanded first ion implantation region 142 and the first impurity region 144 may constitute a source region 146, and the expanded second ion implantation region 152 and the second impurity region 154 may constitute a drain region 156.

Figure 11:
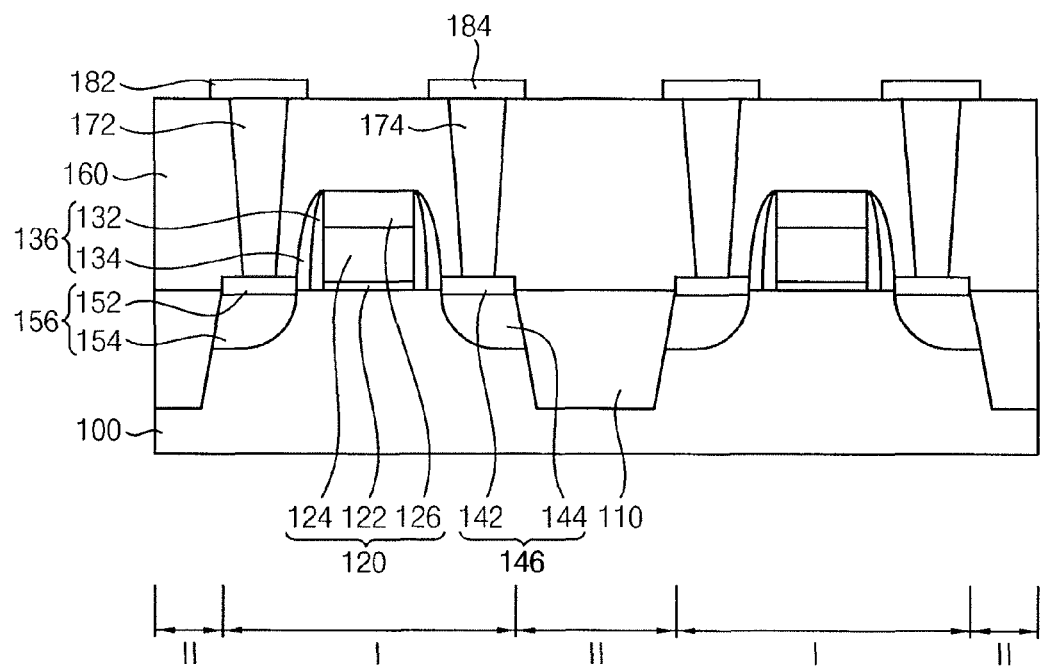

Referring to FIG. 11, contacts 172 and 174 may be formed through the insulating interlayer 160, and then wirings 182 and 184 may be formed on the insulating interlayer 160 to be connected to the contacts 172 and 174, respectively.

Processes for forming the contacts 172 and 174 and the wirings 182 and 184 may be substantially the same as or similar to those described with reference to FIG. 6.

FIGS. 12 to 16 illustrate cross-sectional views of a method of manufacturing a semiconductor device in accordance with some example embodiments.

Figure 12:
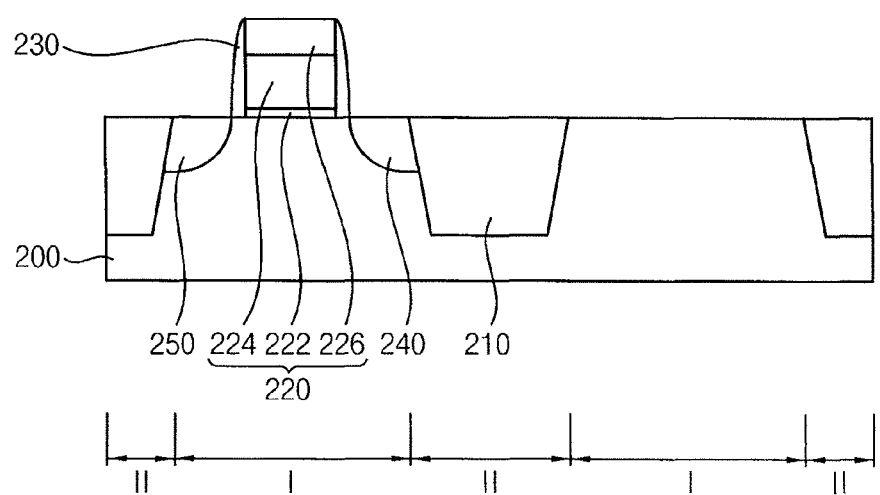

Referring to FIG. 12, an isolation layer 210 may be formed at an upper portion of a substrate 200, and then a gate structure 220 and a spacer 230 may be formed on the substrate 200. Then, a first impurity region 240 and a second impurity region 250 may be formed by doping impurities into the upper portion of the substrate 200.

Processes for forming the isolation layer 210, the gate structure 220 and the spacer 230 may be substantially the same as those described with reference to FIG. 1.

Then, the impurities may be doped into the upper portion of the substrate 200 by using the gate structure 220 and the spacer 230 as a doping mask. Therefore, the first impurity region 240 and the second impurity region 250 may be formed at the upper portion of the substrate 200 adjacent to the gate structure 220.

Figure 13:
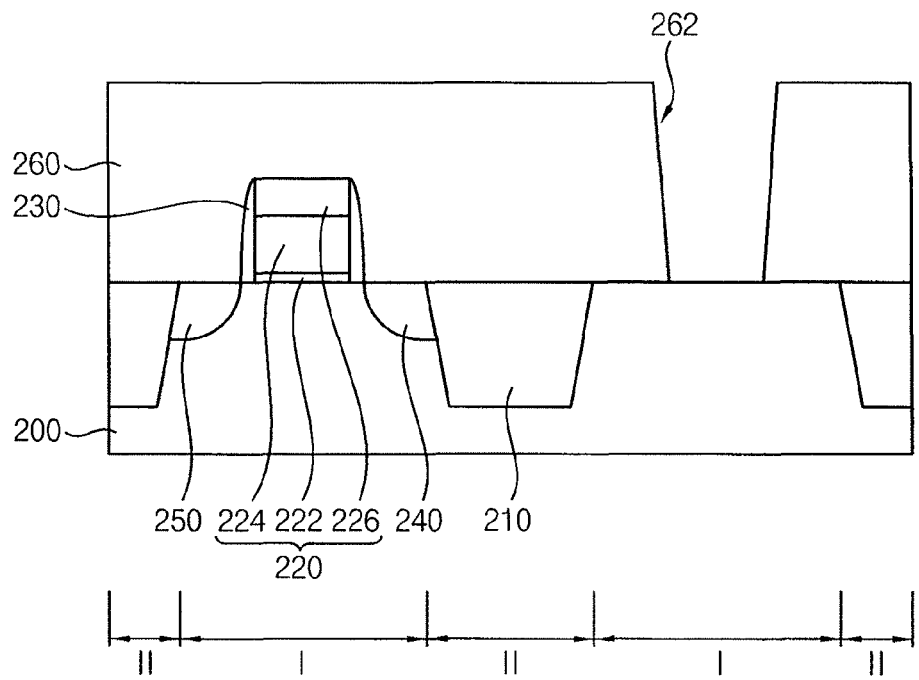

Referring to FIG. 13, an insulating interlayer 260 may be formed to cover the gate structure 220 and the spacer 230, and then the insulating interlayer 260 may be partially removed to form a contact hole 262 exposing a top surface of the substrate 200.

The insulating interlayer 260 may be formed using a silicon oxide or a silicon nitride by a CVD process, a PECVD process or an ALD process.

In example embodiment, the contact hole 262 may expose the top surface of the substrate 200 where the impurity regions 240 and 250 may not be disposed as illustrated in FIG. 13. Alternately, the contact hole 262 may expose the top surface of the substrate 200 where the impurity regions 240 and 250 may be disposed.

Figure 14:
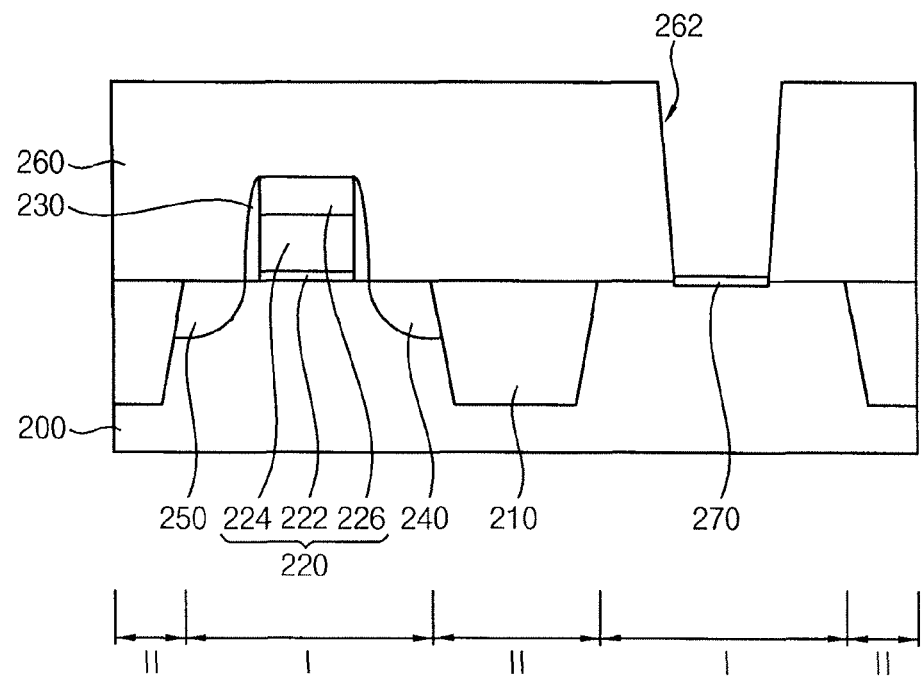

Referring to FIG. 14, an ion implantation process may be performed about upper portions of the substrate 200, thereby forming a first ion implantation region 270.

The ion implantation process may use a predetermined ion which may be substantially identical to a material of the substrate 200. For example, when the substrate 200 includes the silicon substrate, the ion implantation process may implant silicon ions into the upper portion of the substrate 200.

In example embodiments, the ion implantation process may implant the silicon ions with a relatively high concentration of about $1.0E15$ ions/cm$^2$ to about $1.0E20$ ions/cm$^2$ into the upper portion of the substrate 200 exposed by the contact hole 262. Further, a second ion implantation region may be formed at an upper portion of the insulating interlayer 260.

Figure 15:
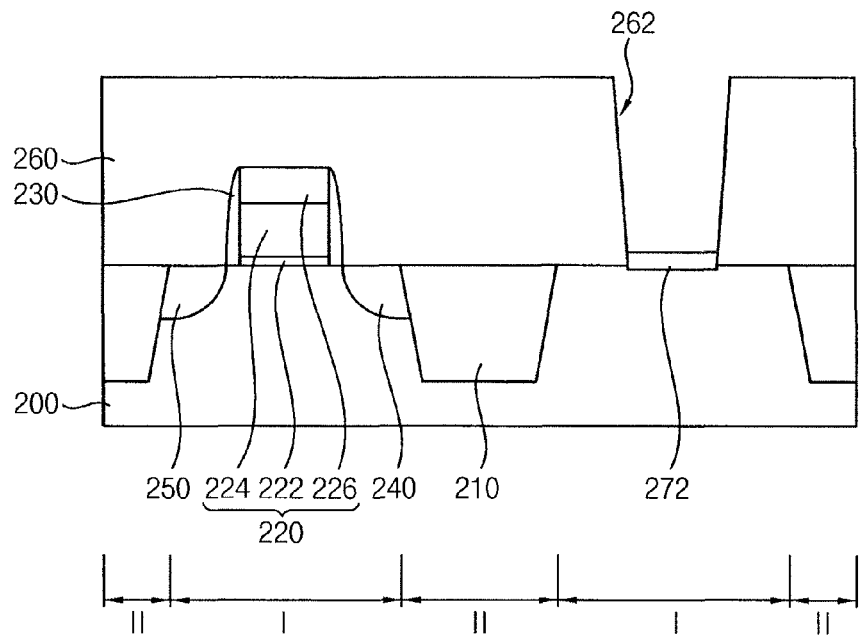

Referring to FIG. 15, a heat treatment process may be performed about the substrate 200 to form an expanded first ion implantation region 272.

The heat treatment process may be substantially the same as the ion implantation process described with reference to FIG. 4. Therefore, the first ion implantation region 270 may be partially or sufficiently crystallized, and so that the first ion implantation region 270 may be transferred into the expanded first ion implantation region 272.

In some example embodiments, an etching process may be selectively performed to remove the second ion implantation region disposed at the upper portion of the insulating interlayer 260. Therefore, a leakage current due to the second ion implantation region may be prevented.

In some example embodiments, impurities may be doped into the expanded first ion implantation region 272 exposed by the contact hole 262. Therefore, an electrical resistance of the expanded first ion implantation region 272 may be reduced.

Figure 16:
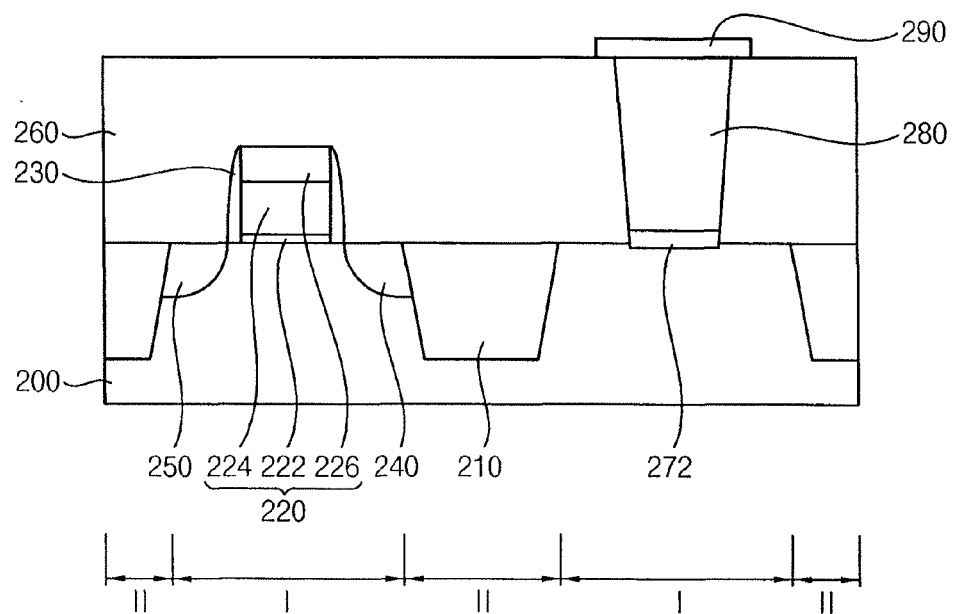

Referring to FIG. 16, a contact 280 may be formed through the insulating interlayer 260, and a wiring 290 may be formed to be electrically in contact with the contact 280.

Processes for forming the contact 280 and the wiring 290 may be substantially the same as or similar to those described with reference to FIG. 6.

According to example embodiments, the expanded first ion implantation region 272 having a top surface higher than that of the substrate 200 may be formed by the ion implantation process. Therefore, an electrical resistance between the contact 280 and the expanded first ion implantation region 272 may be reduced.

FIGS. 17 to 20 illustrate cross-sectional views of a method of manufacturing a semiconductor device in accordance with some example embodiments.

Figure 17:
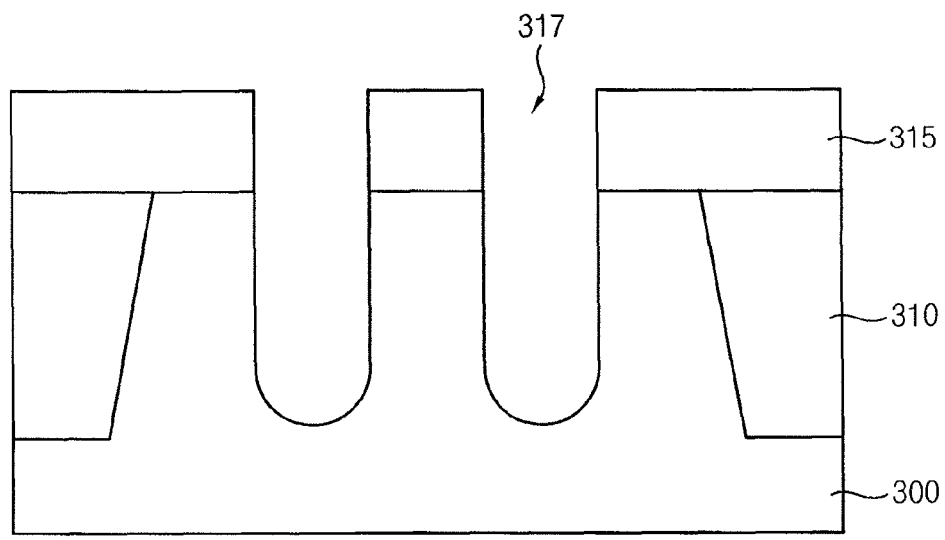
Figure 17:
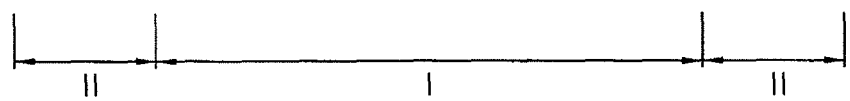

Referring to FIG. 17, an isolation layer 310 may be formed on the substrate 300, and an upper portion of the substrate 300 may be partially removed to form a trench 317.

The substrate 300 may include a semiconductor substrate such as a silicon substrate, germanium substrate or a silicon-germanium substrate, a substrate having a semiconductor layer and an insulation layer such as a silicon-on-insulator (SOI) substrate or a germanium-on-insulator (GOI) substrate, or a single crystalline metal oxide substrate.

The isolation layer 310 may be formed by a shallow trench isolation (STI) process using a silicon oxide and/or a silicon nitride. That is, a recess may be formed by partially removing an upper portion of the substrate 300, and the isolation layer 310 may be formed to fill the recess.

In example embodiments, a mask 315 may be formed on the substrate 300 and the isolation layer 310, and then the substrate 300 and the isolation layer 310 may be partially removed by performing an etching process using the mask 315 as an etching mask, thereby forming the trench 317.

Figure 18:
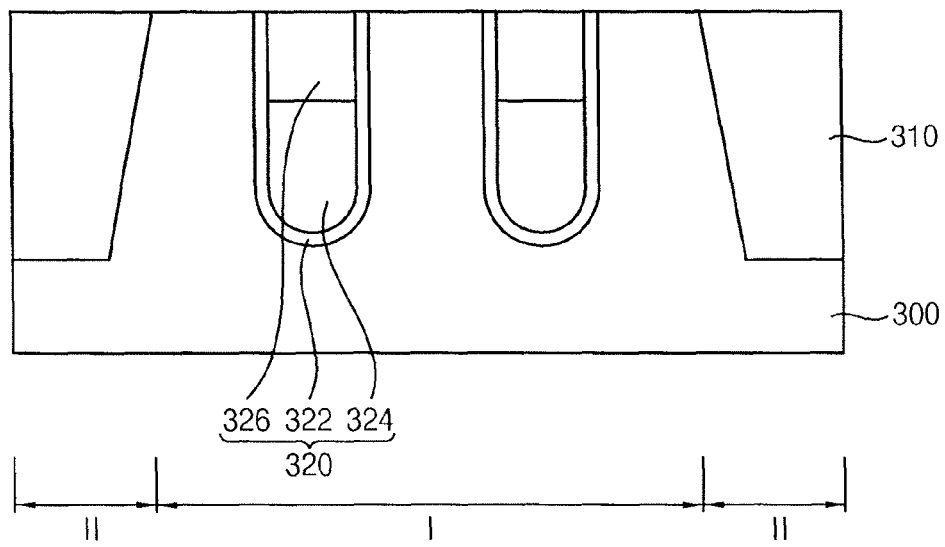
Figure 18:
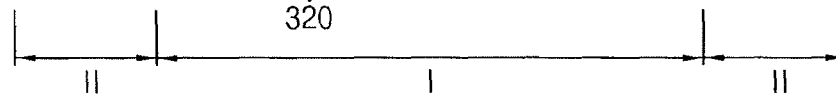

Referring to FIG. 18, a gate insulation layer pattern 322, a gate electrode 324 and a capping layer pattern 326 may be sequentially formed to fill the trench 317.

The gate insulation layer pattern 322 may be formed on an inner wall of the trench 317. In example embodiments, the gate insulation layer pattern 322 may be formed by thermally oxidizing a surface of the substrate 300 exposed by the trench 317. Alternatively, the gate insulation layer pattern 322 may be formed by a deposition process using a silicon oxide, a silicon nitride or a metal oxide having high-k dielectric constant.

The gate insulation layer pattern 322, the gate electrode 324 and the capping layer pattern 326 may constitute a gate structure 320. For example, the gate structure 320 may be a part of a buried channel array transistor including the gate electrode 324 buried at the upper portion of the substrate 300.

Further, the mask 315 may be removed by a planarization process or an etch back process for forming the capping layer pattern 326.

Figure 19:
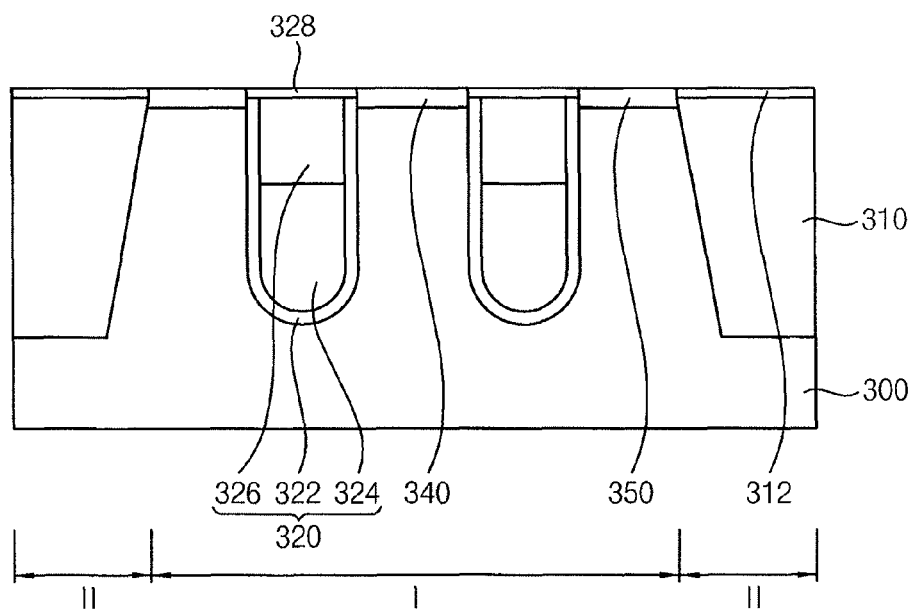

Referring to FIG. 19, an ion implantation process may be performed about upper portions of the substrate 300, the isolation layer 310 and the capping layer pattern 326, thereby forming a first ion implantation region 340, a second ion implantation region 350, a third ion implantation region 312 and a fourth ion implantation region 328.

The ion implantation process may use a predetermined ion which may be substantially identical to a material of the substrate 300. For example, when the substrate 300 includes the silicon substrate, the ion implantation process may dope silicon ions into the upper portions of the substrate 300 and the isolation layer 310.

In example embodiments, the ion implantation process may implant the silicon ions with a relatively high concentration of about $1.0E15$ ions/cm$^2$ to about $1.0E20$ ions/cm$^2$. Further, in order to increase the concentration of silicon ions, the ion implantation process may be repeated several times. During the ion implantation process, the silicon ions may be accelerated by a relatively low energy of about 1 KeV to about 5 KeV. Therefore, the silicon ion may be injected into the substrate 100 to a depth of about 100 Å.

By performing the ion implantation process, the first ion implantation region 340 and the second ion implantation region 350 may be formed on the substrate 300, a third ion implantation region 312 may be formed on the isolation layer 310 and a fourth ion implantation region 328 may be formed on the capping layer pattern 326. That is, the first and second ion implantation regions 340 and 350 may have a silicon ion concentration which may be substantially higher than that of the substrate 300.

Further, the third ion implantation region 312 may have silicon ion concentration which may be substantially higher than that of the isolation layer 310. For example, when the isolation layer 310 includes silicon oxide ($SiO_2$), the third ion implantation region 312 may include silicon oxide (SiOx), wherein 0<X<2. Therefore, the third implantation region 312 may have an electrical resistance which may be smaller than that of the isolation layer 310.

Further, the fourth ion implantation region 328 may have silicon ion concentration which may be substantially higher than that of the capping layer pattern 326. For example, when the capping layer pattern 328 includes silicon oxide ($Si_3N_4$), the fourth ion implantation region 328 may include silicon oxide ($Si_3N_y$), wherein 0<Y<4. Therefore, the fourth ion implantation region 328 may have an electrical resistance which may be smaller than that of the capping layer pattern 328.

The first ion implantation region 340 and the second ion implantation region 350 may be disposed at the upper portion of the substrate 300 adjacent to the gate structure 320. For example, the first ion implantation region 340 and the second ion implantation region 350 may be spaced apart from each other, and the gate structure 320 may be disposed between the first and second ion implantation regions 340 and 350.

By performing the ion implantation process, the upper portion of the substrate 300, which may be exposed by the gate structure 320 and the isolation layer 310, may inflate. Therefore, bottom surfaces of the first and second ion implantation regions 340 and 350 may be lower than a top surface of the capping layer pattern 326, i.e., a top surface of the gate structure 320, and top surfaces of the first and second ion implantation regions 340 and 350 may be higher than a top surface of the capping layer pattern 326, i.e., the top surface of the gate structure 320. That is, the upper portion of the substrate 300, where a source region and a drain region will be formed, may be elevated by the ion implantation process.

Figure 20:
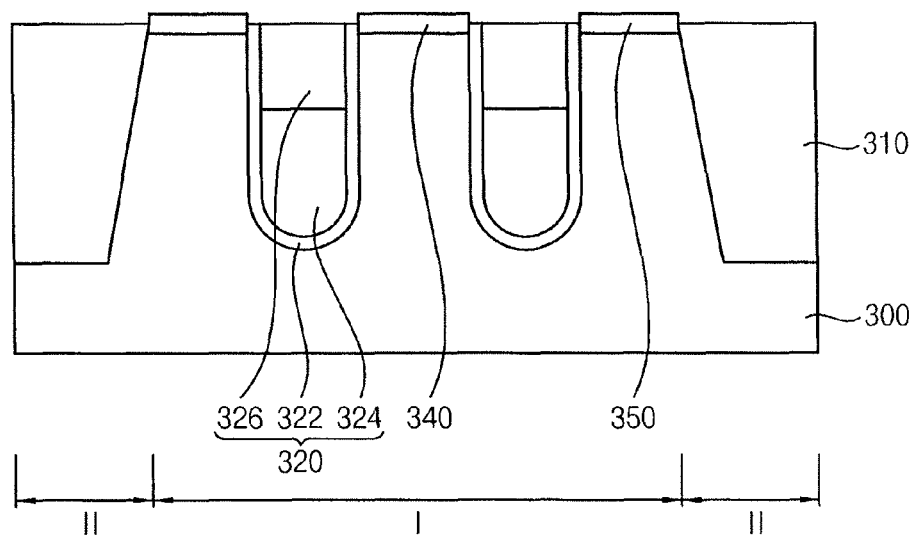

Referring to FIG. 20, the third ion implantation region 312 and the fourth ion implantation region 328 may be selectively removed by a wet etching process.

The wet etching process may be substantially the same as or similar to those described with reference to FIG. 3. Therefore, a leakage current due to the third ion implantation region 312 and the fourth ion implantation region 328 may be prevented.

In some example embodiments, a heat treatment process may be performed about the first ion implantation region 340 and the second ion implantation region 350. Therefore, the first ion implantation region 340 and the second ion implantation region 350 may be partially or sufficiently crystallized, and the first ion implantation region 340 and the second ion implantation region 350 may be expanded.

Then, a bit line and a capacitor may be formed on the substrate 300 to form the semiconductor device.

The foregoing is illustrative of example embodiments and is not to be construed as limiting thereof. Although a few example embodiments have been described, those skilled in the art will readily appreciate that many modifications are possible in the example embodiments without materially departing from the example embodiments. Accordingly, all such modifications are intended to be included within the scope of the example embodiments defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
   forming a gate structure at an upper portion of a substrate; and
   performing an ion implantation process at a predetermined region of the upper portion of the substrate exposed by the gate structure, such that a volume of the predetermined region expands to be larger than a volume before the ion implantation process, thereby forming an ion implantation region in the predetermined region, the ion implantation process using ions which are substantially identical to a material of the substrate.

2. The method of claim 1, wherein the substrate includes a silicon substrate, and the ion implantation process uses silicon ions.

3. The method of claim 2, wherein the ion implantation process implants the silicon ions with a concentration of 1.0E15 ions/$cm^2$ to 1.0E20 ions/$cm^2$.

4. The method of claim 1, wherein:
   the gate structure is formed on the upper portion of the substrate, and
   performing the ion implantation process to expand the volume of the predetermined region includes increasing ion concentration in the predetermined region until a top surface of the ion implantation region is higher than a bottom surface of the gate structure, and a bottom surface of the ion implantation region is lower than the bottom surface of the gate structure.

5. The method of claim 1, wherein:
   the ion implantation region is exposed by the gate structure, and
   performing the ion implantation process to expand the volume of the predetermined region includes increasing ion concentration in the predetermined region to increase a distance between top and bottom surfaces of the predetermined region.

6. The method of claim 1, further comprising:
   forming a source region and a drain region by doping impurities into the ion implantation region.

7. The method of claim 1, further comprising:
   after performing the ion implantation process, performing a heat treatment process at a temperature between 600° C. and 1100° C. to crystallize the ion implantation region, such that a volume of the ion implantation region expands relatively to a volume of the ion implantation region before the heat treatment process.

8. The method of claim 1, further comprising:
   forming an isolation layer including an insulation material at the upper portion of the substrate,
   wherein forming the ion implantation region comprises forming a first ion implantation region exposed by the isolation layer and forming a second ion implantation region on the isolation layer.

9. The method of claim 8, further comprising:
   performing a wet etching process to remove the second ion implantation region.

10. The method of claim 1, further comprising:
    forming a spacer on a sidewall of the gate structure.

11. The method of claim 1, further comprising:
    forming a spacer structure on a sidewall of the gate structure, the spacer structure including a first spacer and a second spacer.

12. The method of claim 1, further comprising:
forming an insulating interlayer to cover the gate structure before performing the ion implantation process; and
partially removing the insulating interlayer to form a contact hole exposing a top surface of the substrate, wherein the ion implantation region is formed at an upper portion of the substrate exposed by the contact hole.

13. The method of claim 1, wherein the ions are accelerated by an energy of 1 KeV to 5 KeV.

14. The method of claim 1, wherein the gate structure is formed to be buried at the upper portion of the substrate.

15. The method of claim 14, wherein a top surface of the ion implantation region is higher than a top surface of the gate structure, and a bottom surface of the ion implantation region is lower than the top surface of the gate structure.

16. A method of manufacturing a semiconductor device, the method comprising:
forming a gate structure on a silicon substrate; and
performing a silicon ion implantation process at a predetermined region of an upper portion of the silicon substrate exposed by the gate structure until a top surface of the predetermined region is higher than a bottom surface of the gate structure, thereby forming an ion implantation region in the predetermined region.

17. The method of claim 16, wherein a bottom surface of the ion implantation region is lower than the bottom surface of the gate structure.

18. The method of claim 16, further comprising:
forming a source region and a drain region by doping n-type impurities or p-type impurities into the ion implantation region.

19. The method of claim 18, wherein bottom surfaces of the source region and the drain region are lower than a bottom surface of the ion implantation region.

20. The method of claim 16, further comprising:
performing a heat treatment process at a temperature between 600° C. and 1100° C. to crystallize the ion implantation region, thereby increasing a volume of the ion implantation region.

* * * * *